(12) United States Patent
Kothandaraman et al.

(10) Patent No.: US 10,551,254 B2
(45) Date of Patent: *Feb. 4, 2020

(54) APPROACH TO MEASURING STRAIN EFFECTS USING RING OSCILLATORS

(71) Applicant: INTERNATIONAL BUSINESS MACHINES CORPORATION, Armonk, NY (US)

(72) Inventors: Chandrasekara Kothandaraman, New York, NY (US); Sami Rosenblatt, White Plains, NY (US); Akil K. Sutton, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/927,224

(22) Filed: Mar. 21, 2018

(65) Prior Publication Data

US 2018/0217012 A1 Aug. 2, 2018

Related U.S. Application Data

(63) Continuation of application No. 15/182,450, filed on Jun. 14, 2016, now Pat. No. 9,970,830.

(51) Int. Cl.
| | | |
|---|---|---|
| *G01L 1/00* | (2006.01) | |
| *G01L 1/14* | (2006.01) | |
| *H03K 3/03* | (2006.01) | |
| *H03K 5/26* | (2006.01) | |
| *H01L 29/78* | (2006.01) | |
| *H01L 23/48* | (2006.01) | |

(52) U.S. Cl.
CPC ............ *G01L 1/14* (2013.01); *H01L 29/7842* (2013.01); *H03K 3/0315* (2013.01); *H03K 5/26* (2013.01); *H01L 23/481* (2013.01)

(58) Field of Classification Search
CPC ..... G01L 1/14; G01R 31/2642; H01L 23/481; H01L 29/7842; H03K 3/0315; H03K 5/26
USPC ......................................................... 73/774
See application file for complete search history.

(56) References Cited

U.S. PATENT DOCUMENTS

| | | |
|---|---|---|
| 8,154,309 B2 | 4/2012 | Agarwal et al. |
| 8,692,571 B2 | 4/2014 | Lai et al. |
| 8,754,696 B2 | 6/2014 | Charlebois et al. |
| 8,847,619 B2 | 9/2014 | Hargan et al. |
| 9,256,246 B1 * | 2/2016 | Lim .......................... G06F 1/10 |

(Continued)

OTHER PUBLICATIONS

List of IBM Patents or Patent Applications Treated as Related dated Mar. 21, 2018, 2 pages.

(Continued)

*Primary Examiner* — Max H Noori
(74) *Attorney, Agent, or Firm* — Tutunjian & Bitetto, P.C.; Vazken Alexanian (57) ABSTRACT

A ring oscillator system for characterizing substrate strain including, a substrate including a through-substrate-via, at least two ring oscillators, wherein a first ring oscillator is closer to the through-substrate-via than a second ring oscillator, and a logic difference circuit that is configured to receive an input from at least the first ring oscillator and the second ring oscillator, and detect a difference between the signal frequency of the first ring oscillator and the signal frequency of the second ring oscillator.

19 Claims, 4 Drawing Sheets

(56) References Cited

U.S. PATENT DOCUMENTS

| | | | |
|---|---|---|---|
| 9,459,309 B2* | 10/2016 | Pak | G01R 31/2601 |
| 10,064,269 B2 | 8/2018 | Rogers et al. | |
| 2010/0100357 A1* | 4/2010 | Harper | G06F 11/3476 |
| | | | 702/187 |
| 2014/0049284 A1 | 2/2014 | Pak et al. | |
| 2014/0225624 A1 | 8/2014 | Chakrabarty et al. | |
| 2017/0356811 A1* | 12/2017 | Kothandaraman | G01L 1/14 |
| 2019/0006493 A1 | 1/2019 | Young et al. | |
| 2019/0019890 A1 | 1/2019 | Ko et al. | |

OTHER PUBLICATIONS

Kim et al., "Silicon Odometer: An On-Chip Reliability Monitor for Measuring Frequency Degradation of Digital Circuits", IEEE Journal of Solid-State Circuits, Apr. 2008, pp. 874-880, vol. 43, No. 4.

Pak, et al., "Wafer-Level TSV Connectivity Test using Ring Oscillator Scheme", 2012 IEEE 21st Conference on Electrical Performance of Electronic Packaging and Systems, Oct. 2012, pp. 228-231.

Keane, et al., "A High Resolution On-Chip Beat Frequency Detection System for Measuring BTI, HCI, and TDDB", 2010 IEEE International Conference on Integrated Circuit Design and Technology, Jun. 2010, pp. 142-145.

Zhao, et al., Design of an Embedded Health Monitoring Infrastructure for Accessing Multi-Processor SoC Degradation, Aug. 2014 17th Euromicro Conference on Digital System Design, pp. 154-160.

\* cited by examiner

APPROACH TO MEASURING STRAIN EFFECTS USING RING OSCILLATORS

BACKGROUND

Technical Field

The present invention relates to an approach to characterizing strain effects using ring oscillators, and more particularly to an apparatus and method of characterizing strain effects introduced by through-silicon-vias (TSV) using Vernier ring oscillators.

Description of the Related Art

Transistors on a substrate can experience changes in their environment that can effect performance and reliability. The transistors typically have performance characteristics based on their chemical and physical makeup. Metal-oxide-semiconductor field-effect transistors (MOSFETs) are a type of transistor having a source, drain, gate, and channel. The different regions of the MOSFET may be p-doped or n-doped.

SUMMARY

A ring oscillator system for characterizing substrate strain including, a substrate including a through-substrate-via, at least two ring oscillators, wherein a first ring oscillator is closer to the through-substrate-via than a second ring oscillator, and a logic difference circuit that is configured to receive an input from at least the first ring oscillator and the second ring oscillator, and detect a difference between the signal frequency of the first ring oscillator and the signal frequency of the second ring oscillator.

A method of measuring strain using ring oscillators including, fabricating a first ring oscillator a first predetermined distance from a through-substrate-via, fabricating a second ring oscillator a second predetermined distance from the same through-substrate-via, where the second predetermined distance is greater than the first predetermined distance, and detecting a difference between the signal frequency of the first ring oscillator and the signal frequency of the second ring oscillator.

A method of measuring strain using ring oscillators including, fabricating a first ring oscillator a first predetermined distance from a through-substrate-via on a substrate, fabricating a second ring oscillator a second predetermined distance from the same through-substrate-via, where the second predetermined distance is greater than the first predetermined distance, fabricating a logic difference circuit on the substrate, and detecting a difference between the signal frequency of the first ring oscillator and the signal frequency of the second ring oscillator, wherein the signal frequency of the first ring oscillator is different from the signal frequency of the second ring oscillator, and the logic difference circuit is configured to provide an output signal that is commensurate with strains imparted to the substrate by the through-substrate-via, wherein a value of the output signal is based on the difference in the signal frequencies.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Principles and embodiments of the present disclosure relate generally to using ring oscillators to measure strain induced changes in transistors based on changes in the gate delay of the inverters (i.e., Logical NOT Gates) making up the ring oscillators. This provides a simple electrical test to monitor through-silicon-via induced stresses.

It has been difficult determining the effect of through-silicon-vias (TSVs) on the performance characteristics (e.g., I-V characteristics) of transistor devices located different distances from the vias. Micro-Raman spectroscopy and X-ray diffraction, which may be used to measure strains, are difficult to perform and can be impossible to implement on an IC product.

The varying proximity of transistors forming, for example, logic devices, from a TSV can induce differing behaviors in the devices, where the distance to a TSV changes the stress and potentially an electric fields in a transistor. The ring oscillators can provide sufficient sensitivity to measure the effects of the TSVs.

The process of forming TSVs can induce axial and radial strain in a substrate that may be used for integrated circuits (ICs). The strains may be introduced by differential thermal expansion of the metal conductor forming/in the via, which may result in cracking of the substrate, for example, with a copper via in a silicon wafer. Without being bound by theory, it is believed that such strains impact the channel mobility and threshold voltage in transistors surrounding the TSV. The quality and robustness of a process used to form TSVs can be determined by measuring the type and degree of the strain effects utilizing a sensitive circuit with a characterizable response to the strain effects.

Since transistor threshold voltage and carrier mobility may be skewed by the proximity of the transistor to a through-silicon-via (TSV), a ring oscillator closer to the TSV may have an oscillation frequency different from a ring oscillator farther away from the same TSV. The test assembly can be formed directly on the substrate, and may be used to monitor the induced strains without delayering or breaking the substrate.

The output of each inverter in a ring oscillator changes by a finite amount of time after the input has changed. The threshold voltage may decrease for transistors closer to a TSV.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In one or more embodiments, the ring oscillator may be a Vernier Ring Oscillator, where the Vernier Ring Oscillator may include the characteristics of a Vernier Delay Line (VDL). The VDL characteristic may be achieved by implementing two separate ring oscillators. In various embodiments including two separate oscillator rings, each inverter stage of each ring oscillator may have a different stage delay as a result of the inverter's proximity to a given TSV, where the stage delay may be influenced by an experienced strain. The difference in inverter stage delays may result in a difference in the oscillation frequency of each ring oscillator, where the difference in oscillation frequency may be proportional to the experienced strain.

A Vernier technique involves a time-to-digital conversion (TDC) of a measured signal. The TDC may be determined by propagating two transient signals ($S_1$ and $S_2$) offset from each other by an initial delay time, $t_D$. Each of the signals, $S_1$ and $S_2$, may be propagated through an inverter chain ($C_1$ and $C_2$ respectively), including a plurality of inverters chained in series, referred to as the Vernier Delay Line (VDL). A principle of a VDL lies in the inverter delay in one inverter chain, $C_1$, being slightly different from the inverter delay in the other inverter chain, $C_2$, by an amount $t_R$. After each inverter stage, a comparison circuit, for example, a D-latch, may be inserted across the inverter chains $C_1$ and $C_2$ and configured to determine which signal from which delay line arrived first. The output from the comparison circuit may be a digital output (i.e., I/O), which may be stored, and/or counted. After a predetermined number of stages (N), the signal being propagated through $C_1$, which may have originally been delayed by $t_D$, may be expected to catch up to the signal propagating through $C_2$, which may have stages with a larger stage delay because $C_2$ may be further from the source of the strain. Once the number of stages has been determined, the bit stream (I/O) from the comparison circuit may essentially represent the time-to-digital conversion of the delay between $S_1$ and $S_2$. The TDC may measure the time interval between the initial start pulses of the two signals, $S_1$ and $S_2$, to the time the two signals arrive together at the comparison circuit. The TDC may be a high frequency counter, where the counter increments when the signal from $C_1$ or $C_2$ arrives. In various embodiments, the TDC may be held at zero until the start event, counts during the interval, and then stops counting after the two signals arrive essentially simultaneously.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It will be understood that, although the terms first, second, etc. may be used herein to describe various elements, these elements should not be limited by these terms. These terms are only used to distinguish one element from another element. Thus, a first element could be termed a second element without departing from the scope of the present concept.

In various embodiments, a TSV may have a diameter in the range of about 6 μm to about 20 μm. An inverter (i.e., NOT gate) fabricated on the substrate is typically much smaller than the dimension of the TSV, which may be in the range of about 5 µm to about 25 µm, although other sizes are contemplated. A plurality of inventors forming a ring oscillator may be fabricated a distance from the TSV. In one or more embodiments, the ring oscillator may be formed as a ring of an odd number of inventors around the TSV, where each inverter is about the same distance from the edge of the TSV. In other embodiments, first ring oscillator and the second ring oscillator may be fabricated in parallel lines on a substrate with a TSV. A logic difference circuit may be fabricated on the substrate in proximity to the first ring oscillator and/or in proximity to the second ring oscillator. The logic difference circuit may be configured to receive an input from at least the first ring oscillator and the second ring oscillator.

Figure 1:
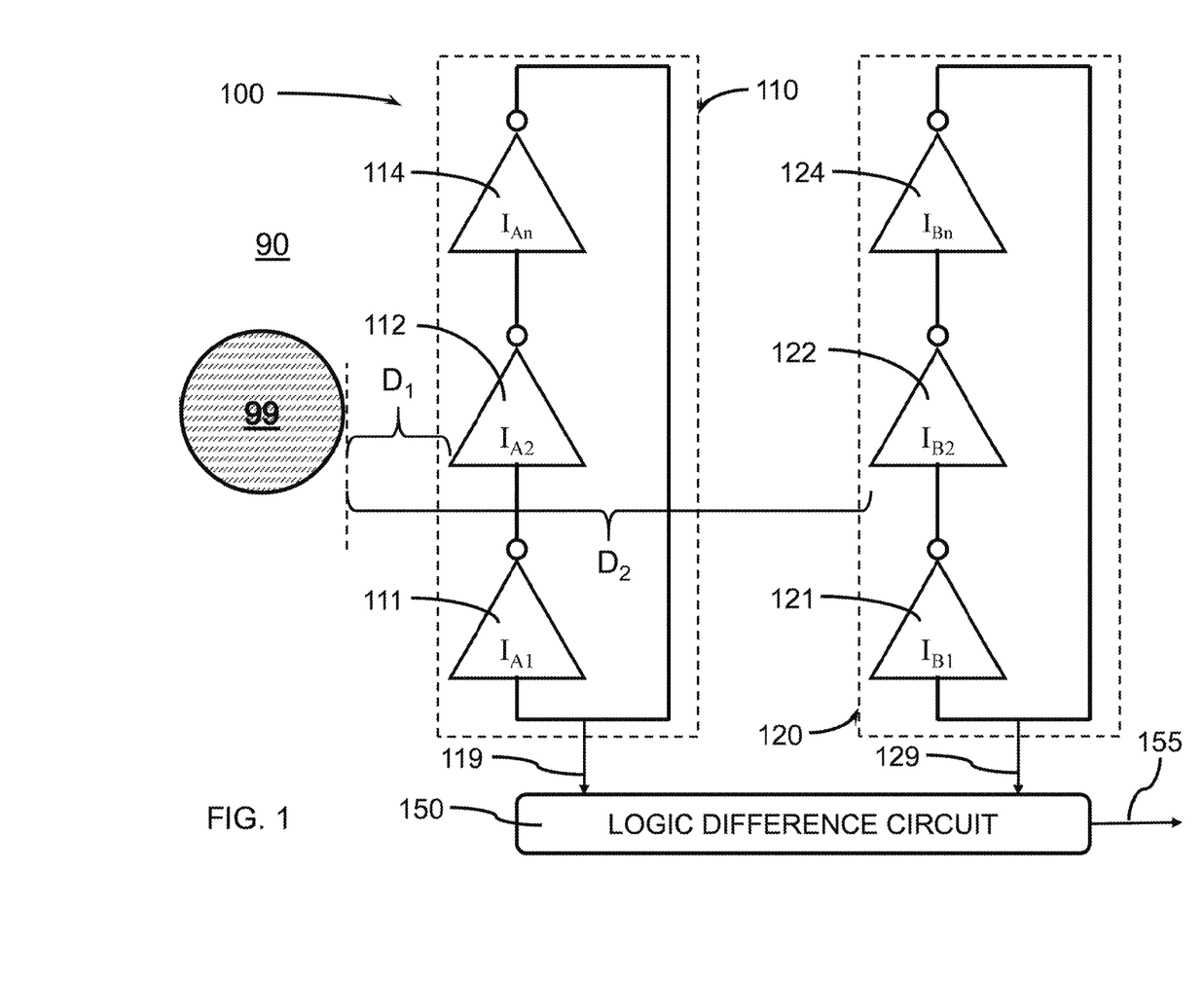
FIG. 1 is a diagram of two ring oscillators arranged parallel to a through-substrate-via in accordance with an illustrative embodiment.

Referring now to the drawings in which like numerals represent the same or similar elements and initially to FIG. 1, which is a diagram of two ring oscillators arranged parallel to a through-substrate-via in accordance with an illustrative embodiment.

In one or more embodiments, a ring oscillator system 100 may include two or more ring oscillators, where a first ring oscillator 110 and a second ring oscillator 120 maybe positioned at different locations on a substrate 90. One or more through-silicon-vias 99 may be formed in the substrate, where vias 99 may include a conductive metal fill. In various embodiments, the through-substrate-vias may be formed in a semiconductor substrate and have an aluminum, tungsten, or copper fill, or more specifically, the through-substrate-vias may be formed in a silicon substrate and have a copper fill.

In one or more embodiments, the first ring oscillator 110 and the second ring oscillator 120 maybe different distances from the TSV 99. In various embodiments, a first ring oscillator 110 may be located a distance, $D_1$, from the TSV 99, where the distance, $D_1$, may be measured from a center point of the TSV or an edge of the TSV. In various embodiments, second ring oscillator 120 may be located a distance, $D_2$, from the TSV 99, where the distance, $D_2$, may be measured from a center point of the TSV or an edge of the TSV. In various embodiments, distance, $D_2$, is greater than distance, $D_1$, so second ring oscillator 120 is farther from the TSV than first ring oscillator 110. A ring oscillator may be far from the TSV 99 such that any difference in distance of the inverter stages is negligible compared to the overall distance of the inverter stage(s) to the TSV ($D_2$, $>>\Delta D_2$), where such ring oscillator may be a reference ring oscillator.

Without being bound by theory, during formation of a TSV, which can include thermal processing steps, the substrate my experience thinning/reflow, which may alter the stress state of the substrate and impart strains. In various instances, the stress may be due to the mis-match between the coefficient of thermal expansion for the substrate and the fill material of the via, and may be expressed as $\varepsilon=-(\alpha_{Cu}-\alpha_{Si}) \Delta T$, where $\Delta T$ may be from a heat treatment (e.g., deposition temperature, high temperature annealing). The TSV stress effect attenuates as $1/r^2$, where 'r' is the distance from the source of the stress. The resulting strains may alter the electrical characteristics of a field effect transistor (FET) channel, for example, the channel carrier mobility and threshold voltage. Transistors forming the inverters (e.g., a coupled PMOS and NMOS pair) located different distances from a stress source may experience differently attenuated stresses and strains. The difference in strain experienced by the channels of FET devices at different distances from the strain source may result in different delays.

In one or more embodiments, the ring oscillators 110, 120 may include an odd number (e.g., 3, 5, 7, 9, etc.) of inverters, such that there are three or more inverters forming the first ring oscillator 110, and three or more inverters forming the second ring oscillator 120. The first ring oscillator 110 and the second ring oscillator 120 may include the same odd number of inverters, so both ring oscillators would initially have essentially the same frequency. Adding more inverters to the ring oscillator can reduce the oscillator frequency.

In various embodiments, the ring oscillators may have different geometric arrangements. The ring oscillators may be a linear arrangement of inventors, or a circular arrangement of inventors or other geometric shaped arrangements (e.g., pentagonal, hexagonal, etc.). The geometric arrangements may be adjacent to a TSV or centered around a TSV 99.

In an exemplary embodiments, as illustrated in FIG. 1, a first ring oscillator 110 having a linearly arrangement of 'n' inverters 111, 112, 114 ($I_{A1}$, $I_{A2}$, . . . $I_{An}$) may be located adjacent to a TSV 99. A second ring oscillator 120 having a linearly arrangement of 'n' inverters 121, 122, 124 ($I_{A1}$, $I_{A2}$, . . . $I_{An}$) may be located further from TSV 99 than the first ring oscillator 110. In one or more embodiments, the second ring oscillator 120 may be on the same side of the TSV 99 as the first ring oscillator 110. In various other embodiments, the second ring oscillator 120 may be on the opposite side of the TSV 99 as the first ring oscillator 110, or on any other side of the TSV 99 as long as one of the ring oscillators is farther from the TSV 99 than the other ring oscillator. The linear arrangement of the first ring oscillator 110 and the second ring oscillator 120 may form parallel lines.

A distance may be measured from the component of the ring oscillator closest to the TSV to the edge of a TSV. In a linear arrangement, one of the inverters may be the closest to the TSV, whereas in a circular or polygonal arrangement all of the inverters may be approximately an equal distance from the edge or center of the TSV.

In one or more embodiments, the closest point of the first ring oscillator is in the range of about 3 µm to about 7 µm from the closest edge of the through-substrate-via, and the closest point of the second ring oscillator is in the range of about 10 µm to about 100 µm from the closest edge of the through-substrate-via.

In one or more embodiments, the output 119 of the first ring oscillator 110 and the output 129 of the second ring oscillator 120 may me inputted into a logic difference circuit 150, where the logic difference circuit 150 may be configured to determine a difference between the first ring oscillator output signal and the second ring oscillator output signal. The ring oscillator outputs may be an oscillating signal having a frequency, where the difference in frequencies may be detected and/or measured by superimposing the signals and detecting/counting the beats generated, measuring an output signal having a frequency that is based on the difference between the signal frequency of the first ring oscillator and the signal frequency of the second ring oscillator, or using a time-to-digital converter.

In various embodiments, the difference circuit output 155 may indicate the difference between the first ring oscillator frequency and the second ring oscillator frequency, where the output 155 from the difference circuit may be commensurate with the difference in strain experienced by the inverters of the first ring oscillator 110 and the inverters of the second ring oscillator 120.

Figure 2:
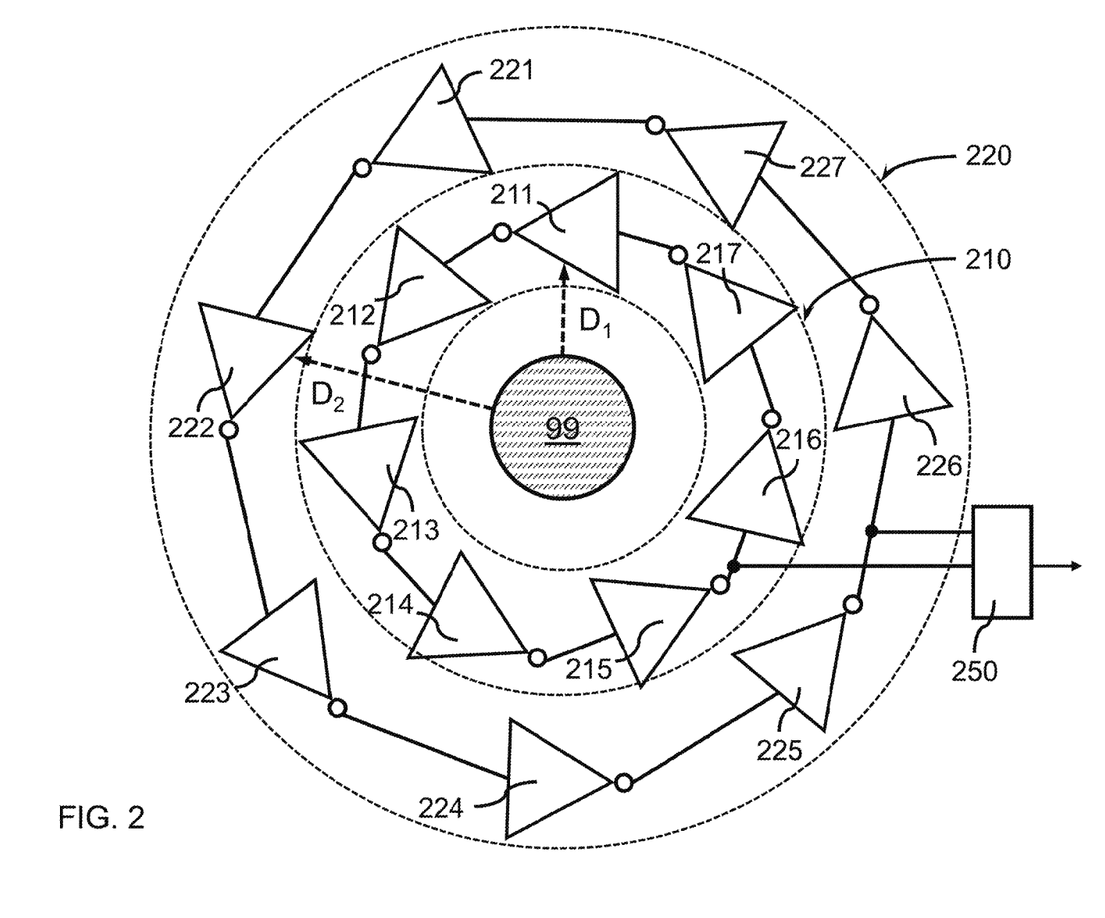
FIG. 2 is a diagram of two ring oscillators arranged in concentric circles around a through-substrate-via in accordance with an illustrative embodiment.

FIG. 2 is a diagram of two ring oscillators arranged in concentric circles around a through-substrate-via in accordance with an illustrative embodiment.

In one or more embodiments, a ring oscillator may fabricated on a substrate around a TSV 99. In an exemplary embodiments, as illustrated in FIG. 2, a first ring oscillator 210 may include seven (7) inverters (211, 212, 213, 214, 215, 216, and 217) surrounding a TSV 99 in a circle having a diameter, $D_1$, and a second ring oscillator 220 may include seven (7) inverters (221, 222, 223, 224, 225, 226, and 227) surrounding a TSV in a circle having a diameter, $D_2$.

In one or more embodiments, the first ring oscillator 110, 210 may be a distance in the range of about 10 μm to about 30 μm from the edge of the through-substrate-via, and the second ring oscillator 120, 220 may be a distance in the range of about 50 μm to about 100 μm from the edge of the through-substrate-via.

The first ring oscillator 110, 210 and the second ring oscillator 120, 220 may include one or more long channel, p-doped channel metal oxide silicon field effect transistors (MOSFETs), where a long channel MOSFET can have a channel with a length that is greater than the sum of the source width and the drain width, so as to be able to ignore edge effects. A long channel FET can be more sensitive to stress, thereby experiencing a greater difference in gate delay between a more highly stressed device and a less stressed device. A long channel PFET may show the greatest sensitivity, with time and/or threshold voltage, $V_t$, decreasing for devices close to a TSV.

In one or more embodiments, a phase comparator 250 may receive signals from the first ring oscillator 210 and the second ring oscillator 220, and determine a difference, for example, in frequency, between the two received signals, where the difference in signals may be commensurate (e.g., proportional) with the difference in strain effecting first ring oscillator 210 and second ring oscillator 220. The ring oscillator closer to the source of strain (e.g., the TSV) may have a higher frequency than the ring oscillator further away from the source of the strain. The phase comparator 250 may detect the beats generated by the difference in frequencies, $f_{pc}=f_{ro1}-f_{ro2}$, of the signals received from first ring oscillator 210 and second ring oscillator 220, and count the beats to establish a measurement of the strain produced by the TSV 99. The induced strain on the ring oscillator may be quantified based on the difference in the two frequencies.

Figure 3:
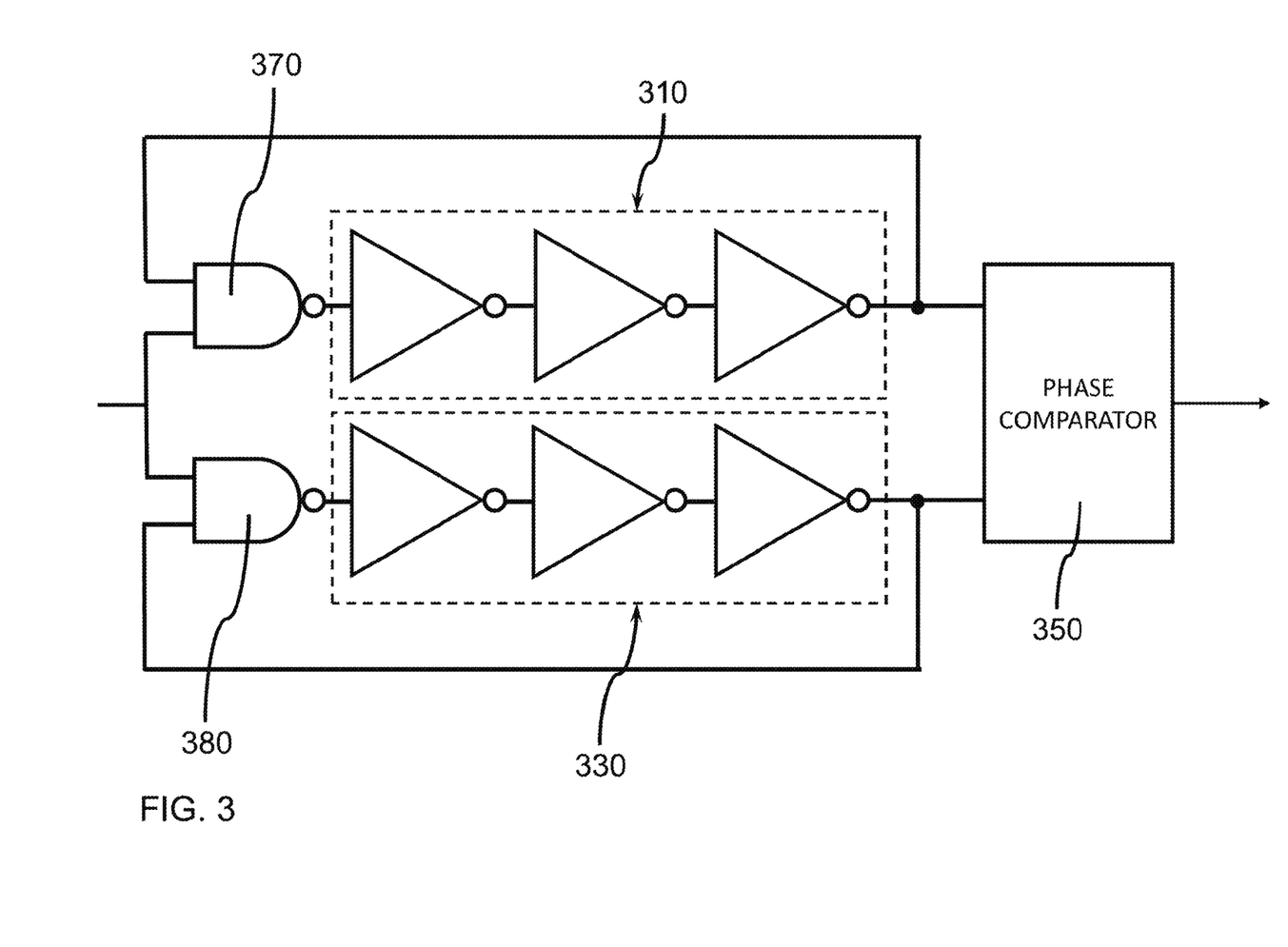
FIG. 3 is a diagram of two ring oscillators and a phase comparator for frequency measurements in accordance with an illustrative embodiment.

FIG. 3 is a diagram of two ring oscillators and a phase comparator for frequency measurements in accordance with an illustrative embodiment.

In one or more embodiments, a reference ring oscillator 330 may be included to generate a reference frequency having a predetermined frequency value that is fed into the phase comparator 350, which is configured to measure the difference in frequencies between the stressed ring oscillator 310 and the reference ring oscillator 330, $f_{pc}=f_{ref}-f_{stress}$. The reference ring oscillator 330 may be far from the stress source(s) to avoid strain influences, whereas the stressed ring oscillator 310 may be located 20 μm or less from a stress source. In various embodiments, the phase comparator may be fabricated on the same substrate as the ring oscillators and the TSV.

In one or more embodiments, the ring oscillator(s) may include a NAND gate 370, 380, where the NAND gate can be used to enable or disable the oscillations, since the oscillator may only function when the NAND gate is enabled.

Figure 4:
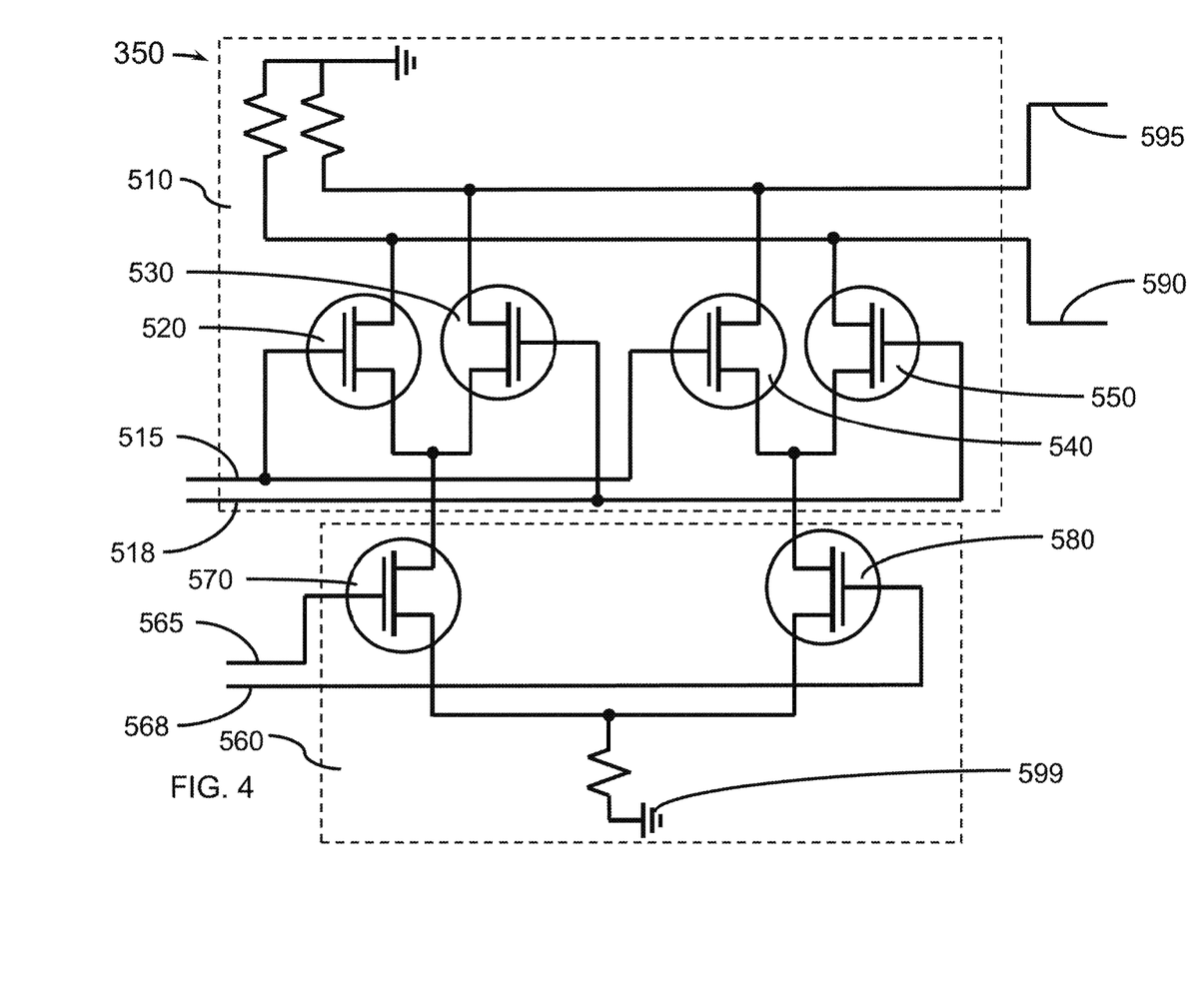
FIG. 4 is a diagram of a phase comparator for beat frequency measurements in accordance with an illustrative embodiment.

FIG. 4 is a diagram of a phase comparator for beat frequency measurements in accordance with an illustrative embodiment.

In one or more embodiments, a ring oscillator 310 experiencing a strain may generate an output signal that is sampled using a reference ring oscillator 330, where an output signal is produced that is proportional to the difference in the frequencies. The strain may be determined by comparing a signal generated by the first ring oscillator to a signal generated by the second ring oscillator to obtain an output signal commensurate with a difference in strains experienced by the first ring oscillator and the second ring oscillator. In one or more embodiments, the phase comparator 350 may be a Gilbert Cell. In various embodiments, cascading may be employed to improve the performance of the circuits.

In one or more embodiments, a phase comparator 350 may include circuitry forming a stressed ring oscillator detector circuit 510, and a reference ring oscillator circuit 560, where the signal from the stressed ring oscillator 310 is multiplied by the output signal from the reference ring oscillator 330. In various embodiments, the output signal from one of the inverters forming a stressed ring oscillator 310 may be input to input lines 515 and 518 of a stressed ring oscillator detector circuit 510, where the signal is applied to the gates of two cross-coupled field effect transistor (FET) pairs 520, 530, 540, 550. An output signal from one of the inverters forming the reference ring oscillator 330 may be input to input lines 565 and 568 of a reference ring oscillator detector circuit 560, where the signal is applied to the gates of FETs 570, 580.

In various embodiments, when the inverter output from the stressed ring oscillator 310 is high (i.e., '1') the input lines 515, 518 and the gates for field effect transistors (FETs) 520, 530, 540, 550 are also driven high. If the input signal from the inverter of the reference ring oscillator 330 is also high (i.e., '1'), then the input lines 565, 568 are also high. When the input lines 515, 518 are high, and the input lines 565, 568 are also high, output lines 590, 595 are coupled to ground 599, so are low (i.e., 0, grounded). When the input lines 515, 518 are high, and the input lines 565, 568 are low, then output lines 590, 595 have a signal driven by FETs 520, 530, 540, 550, such that the output signal on lines 590, 595 are proportional to difference in frequencies between the input signal on input lines 515 and 518 and input signal on input lines 565 and 568. The phase comparator can essentially amplify the difference in the phase of the two inputs, coming from 310 and 330 of FIG. 3, where ring oscillator 310 drives the input 515, 518 and ring oscillator 330 drives the input 565, 568 to provide an output voltage on 590 and 595 that is proportional to the difference in the frequencies of the inputs The output from phase comparator 350 may be measured to determine the strain induced by the TSV.

Having described preferred embodiments of a system and method characterizing strain effects using ring oscillators (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A ring oscillator system for characterizing substrate strain, comprising:
    a substrate including a through-substrate-via;
    at least two ring oscillators on the substrate, wherein two of the at least two ring oscillators are spaced apart from the through-substrate-via and from each other, wherein a first of the two of the at least two ring oscillators and a second of the two of the at least two ring oscillator each include one or more long channel, p-doped metal oxide silicon field effect transistors (MOSFETs); and a logic difference circuit on the substrate, wherein the logic difference circuit is operatively associated with the two of the at least two ring oscillators.

2. The ring oscillator system of claim 1, wherein each of the at least two ring oscillators comprises the same odd number of inverter devices.

3. The ring oscillator system of claim 1, wherein the first ring oscillator and the second ring oscillator of the two of the at least two ring oscillators fond concentric circles around the through-substrate-via.

4. The ring oscillator system of claim 3, wherein the first ring oscillator is in the range of about 10 μm to about 30 μm from the edge of the through-substrate-via, and the second ring oscillator is in the range of about 50 μm to about 100 μm from the edge of the through-substrate-via.

5. The ring oscillator system of claim 1, wherein the first ring oscillator and the second ring oscillator of the two of the at least two ring oscillators are parallel to each other.

6. The ring oscillator system of claim 5, wherein a closest point of the first ring oscillator is in a range of about 3 μm to about 7 μm from the closest edge of the through-substrate-via and the second ring oscillator is further from the closest edge of the through-substrate-via than the first ring oscillator.

7. The ring oscillator system of claim 1, wherein the logic difference circuit is a phase comparator that is configured to provide an output signal having a frequency that is based on the difference between a signal frequency of the first ring oscillator and a signal frequency of the second ring oscillator.

8. The ring oscillator system of claim 7, wherein the logic difference circuit is a phase comparator that comprises a third ring oscillator that is configured to provide a reference signal at a predetermined frequency.

9. The ring oscillator system of claim 1, wherein a signal frequency of the first ring oscillator is different from a signal frequency of the second ring oscillator, and the logic difference circuit is configured to provide an output signal that is commensurate with strains imparted to the substrate by the through-substrate-via, wherein a value of the output signal is based on the difference in the signal frequencies.

10. A method of measuring strain using ring oscillators, comprising:
    fabricating a first ring oscillator on a substrate a first distance from a through-substrate-via;
    fabricating a second ring oscillator on the substrate a second distance from the same through-substrate-via, wherein the second distance is greater than the first distance; and
    detecting a difference between the signal frequency of the first ring oscillator and the signal frequency of the second ring oscillator that is commensurate with strains imparted to the substrate by the through-substrate-via.

11. The method of claim 10, wherein fabricating the first ring oscillator involves fabricating an odd number of inverters connected in series, and fabricating the second ring oscillator involves fabricating the same odd number of inverters connected in series as fabricated for the first ring oscillator.

12. The method of claim 10, wherein the first ring oscillator and the second ring oscillator are fabricated as concentric circles around the same through-substrate-via.

13. The method of claim 12, wherein the first ring oscillator is in the range of about 10 μm and about 30 μm from the edge of the through-substrate-via, and the second ring oscillator is in the range of about 50 μm to about 100 μm from the edge of the through-substrate-via.

14. The method of claim 10, wherein the first ring oscillator and the second ring oscillator are fabricated in parallel lines.

15. The method of claim 14, wherein the first ring oscillator includes one or more long channel, p-doped channel MOSFETs.

16. The method of claim 15, wherein the closest point of the first ring oscillator is in the range of about 3 μm to about 7 μm from the closest edge of the through-substrate-via, and the closest point of the second ring oscillator is in the range of about 10 μm to about 100 μm from the closest edge of the through-substrate-via.

17. The method of claim 10, which further comprises providing an output signal having a frequency that is based on the difference between the signal frequency of the first ring oscillator and the signal frequency of the second ring oscillator.

18. The method of claim 17, further comprising comparing the signal frequency of the first ring oscillator and the signal frequency of the second ring oscillator to a reference signal at a predetermined frequency.

19. A method of measuring strain using ring oscillators, comprising:
    fabricating a first ring oscillator a first distance from a through-substrate-via on a substrate;
    fabricating a second ring oscillator a second distance from the same through-substrate-via;
    fabricating a logic difference circuit on the substrate, wherein the logic difference circuit is operatively coupled to the first ring oscillator and the second ring oscillator;
    detecting a difference between the signal frequency of the first ring oscillator and the signal frequency of the second ring oscillator; and
    comparing the signal frequency of the first ring oscillator and the signal frequency of the second ring oscillator, that are commensurate with strains imparted to the substrate by the through-substrate-via, to a reference signal at a predetermined frequency.

* * * * *